(12) United States Patent
Kim et al.

(10) Patent No.: US 9,899,463 B2
(45) Date of Patent: Feb. 20, 2018

(54) DISPLAY DEVICE

(71) Applicant: LG DISPLAY CO., LTD., Seoul (KR)

(72) Inventors: Dongjun Kim, Seoul (KR); Chungwan Oh, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 15/253,146

(22) Filed: Aug. 31, 2016

(65) Prior Publication Data

US 2017/0062546 A1 Mar. 2, 2017

(30) Foreign Application Priority Data

Aug. 31, 2015 (KR) .................. 10-2015-0123249

(51) Int. Cl.
*H01L 27/12* (2006.01)
*H01L 27/32* (2006.01)
*G09G 3/3233* (2016.01)
*G09G 3/3275* (2016.01)
*G09G 3/3266* (2016.01)
*H01L 27/15* (2006.01)

(52) U.S. Cl.
CPC ....... *H01L 27/3276* (2013.01); *G09G 3/3233* (2013.01); *G09G 3/3266* (2013.01); *G09G 3/3275* (2013.01); *H01L 27/124* (2013.01); *H01L 27/1244* (2013.01); *H01L 27/15* (2013.01); *G09G 2310/0289* (2013.01); *G09G 2310/08* (2013.01); *H01L 2227/323* (2013.01)

(58) Field of Classification Search
CPC .................................................. H01L 21/8232
See application file for complete search history.

(56) References Cited

U.S. PATENT DOCUMENTS 9,768,205 B2 * 9/2017 Sato .................... H01L 27/1255

* cited by examiner

*Primary Examiner* — Cheung Lee
(74) *Attorney, Agent, or Firm* — Birch, Stewart, Kolasch & Birch, LLP

(57) ABSTRACT

A display device including a substrate, a display portion positioned on the substrate and a pad portion positioned outside the display portion, a jumping portion positioned between the display portion and the pad portion, at least two power lines positioned on the substrate, a connection pattern connecting the at least two power lines to each other in the jumping portion, and an insulating layer spaced apart from the connection pattern and surrounding the connection pattern to prevent residue defects and short circuit defects at the jumping portion.

20 Claims, 10 Drawing Sheets

DISPLAY DEVICE

CROSS REFERENCE TO RELATED APPLICATIONS

This application claims priority from and the benefit under 35 U.S.C. § 119(a) of Korean Patent Application No. 10-2015-0123249, filed on Aug. 31, 2015, which is hereby incorporated by reference for all purposes as if fully set forth herein.

BACKGROUND OF THE INVENTION

Field of the Invention

The present disclosure relates to a display device, and more particularly, to a display device preventing a residue defect and a short circuit defect of lines.

Description of the Related Art

Various flat panel displays (FPDs) have replaced heavier and larger cathode ray tubes (CRTs). Examples of the flat panel display include a liquid crystal display (LCD), a field emission display (FED), a plasma display panel (PDP) and an organic light emitting diode (OLED) display.

In more detail, an OLED display is a self-emission display device configured to emit light by exciting an organic compound. The OLED display does not require a backlight unit used in a liquid crystal display and thus has a thin profile and lightness in weight and a simpler manufacturing process. The OLED display can be also manufactured at a low temperature and has a fast response time of 1 ms or less, low power consumption, a wide viewing angle, and a high contrast.

Further, the OLED display includes a light emitting layer formed of an organic material between a first electrode serving as an anode and a second electrode serving as a cathode. The OLED display forms hole-electron pairs, excitons, by combining holes received from the first electrode and electrons received from the second electrode inside the light emitting layer and emits light by energy generated when the excitons return to a ground level.

In addition, the OLED display includes a display area, in which an image is implemented through a plurality of pixels, and a non-display area positioned outside the display area. In the non-display area, a plurality of lines used to supply various signals to the plurality of pixels of the display area are disposed. In particular, the plurality of lines are generally made using metals having a low resistance, but the lines on the same layer occupy a large area of the bezel.

The OLED display uses the anode as the line of the non-display area, so as to decrease the bezel of the non-display area. However, when an anode layer is patterned, a residue of the anode remains. Thus, as shown in FIG. 1, a short circuit defect is generated between the residue of the anode and layers stacked on the residue of the anode due to the residue problem of the anode pattern, thereby reducing the reliability of the OLED display.

SUMMARY OF THE INVENTION

Accordingly, one aspect of the present invention is to provide a display device for preventing a residue defect and a short circuit defect of lines.

In one aspect, a display device includes a substrate, a display portion positioned on the substrate and a pad portion positioned outside the display portion, a jumping portion positioned between the display portion and the pad portion, at least two power lines positioned on the substrate, a connection pattern connecting the at least two power lines to each other in the jumping portion, and an insulating layer spaced apart from the connection pattern and surrounding the connection pattern.

In another aspect, the present invention provides a display device including a display portion on a substrate, a pad portion disposed outside the display portion on the substrate, a first initialization power line extended from the display portion, a second initialization power line connected to the pad portion, and a second initialization power line connected to the pad portion. The display device further includes a high potential power line disposed between the first and second initialization power lines, a low potential power line disposed on one side of the high potential power line and connected to the pad portion, a jumping portion disposed between the display portion and the pad portion, a connection pattern for connecting the first and second initialization power lines to each other in the jumping portion, and an insulating layer surrounding a horizontal portion of the connection pattern and not surrounding a vertical portion of the connection pattern.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

A display device according to an embodiment of the present invention is a plastic display device, in which a display element is formed on a flexible plastic substrate. Examples of the plastic display device include the OLED display, the LCD, and an electrophoresis display. Embodiments of the present invention are described using the OLED display as an example of the plastic display device. The OLED display according to the embodiment of the invention may use a glass substrate as well as the plastic substrate.

A display device according to an embodiment of the present invention may also use a liquid crystal display instead of the above-described OLED display. For example, when an embodiment of the present invention is applied to the liquid crystal display, a pixel electrode or a common electrode of the liquid crystal display is formed as a transparent conductive layer, in the same manner as an anode according to the embodiment of the present invention. Therefore, the anode according to the embodiment of the present invention can be applied to lines of a power supply unit of the liquid crystal display.

Embodiments of the invention are described below with reference to FIGS. 2 to 15.

Figure 1:
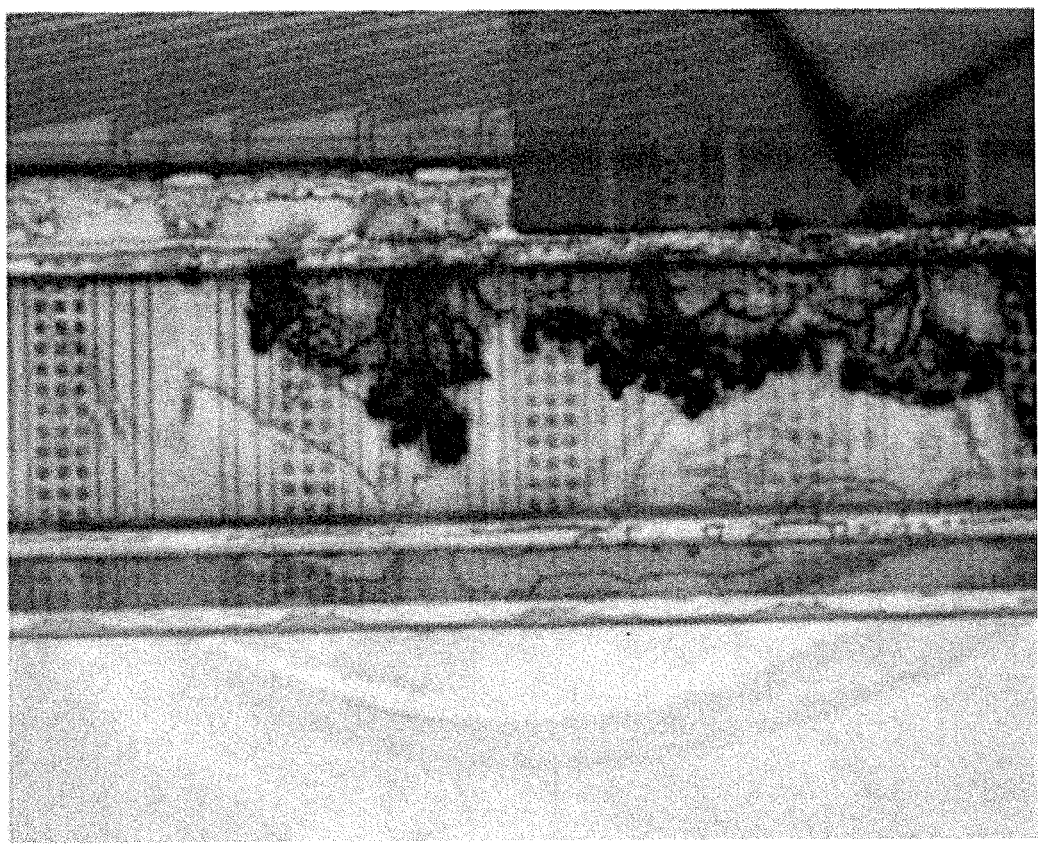
FIG. 1 is an image illustrating a short circuit generated in a related art OLED display.
Figure 2:
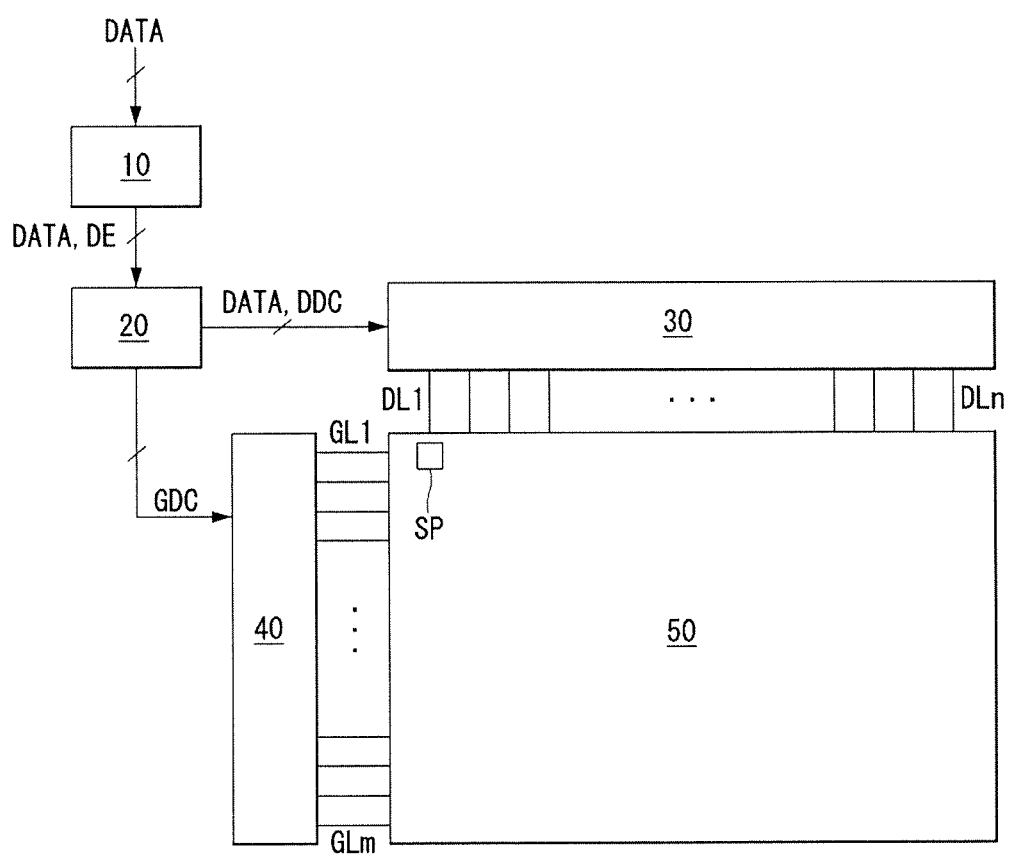
FIG. 2 is a schematic block diagram of an OLED display.
Figure 3:
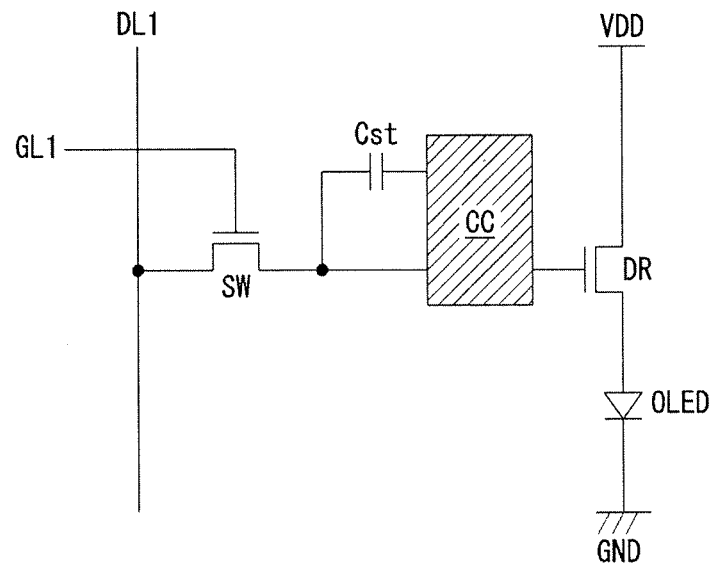
FIG. 3 illustrates a first example of a circuit configuration of a subpixel.
Figure 4:
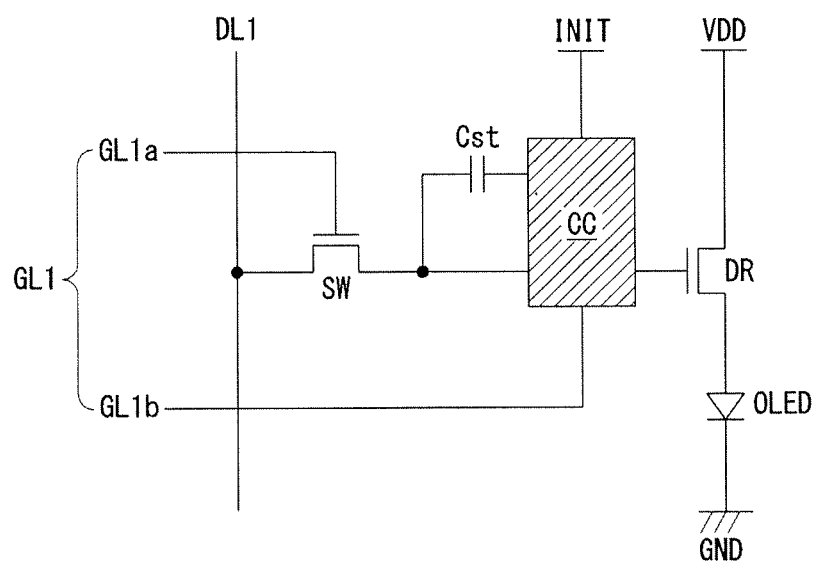
FIG. 4 illustrates a second example of a circuit configuration of a subpixel.
Figure 5:
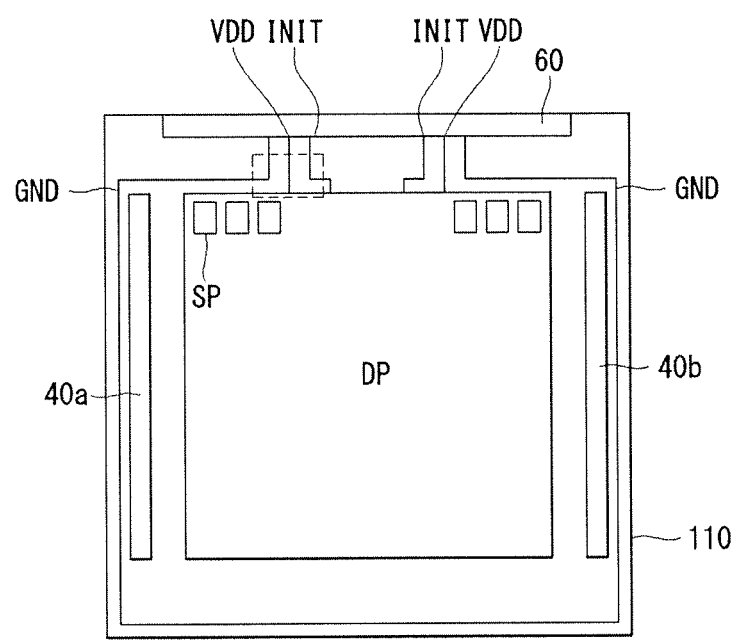
FIG. 5 is a plan view illustrating an OLED display.
Figure 6:
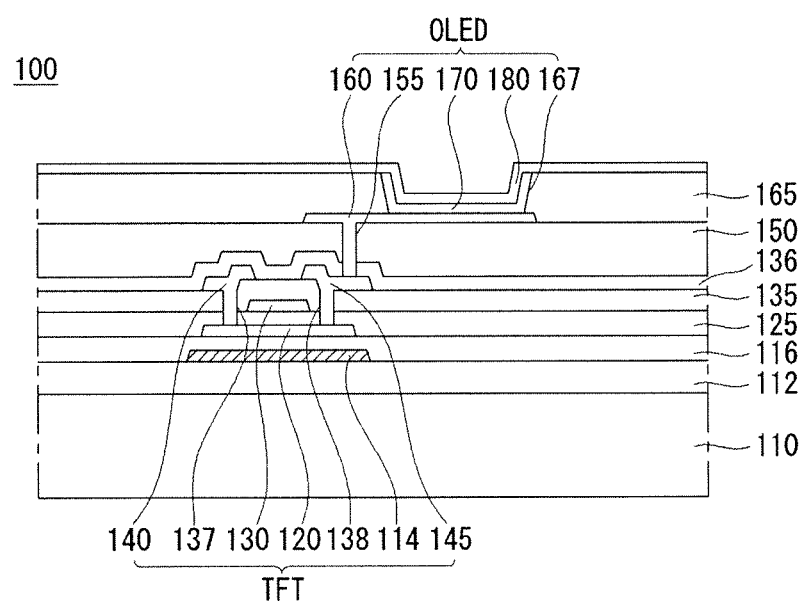
FIG. 6 is a cross-sectional view of a subpixel of an OLED display.

In more detail, FIG. 2 is a schematic block diagram of an OLED display, FIGS. 3 and 4 illustrate a first and a second example of a circuit configuration of a subpixel, FIG. 5 is a plan view illustrating an OLED display, and FIG. 6 is a cross-sectional view of a subpixel of an OLED display according to an embodiment of the present invention.

Referring to FIG. 2, the OLED display according to an embodiment of the invention includes an image processing unit 10, a timing controller 20, a data driver 30, a gate driver 40, and a display panel 50. The image processing unit 10 outputs a data signal DATA and a data enable signal DE supplied from the outside, and can output one or more of a vertical sync signal, a horizontal sync signal, and a clock signal in addition to the data enable signal DE. The image processing unit 10 is formed on a system circuit board in an integrated circuit (IC) form.

Further, the timing controller 20 receives the data signal DATA and a driving signal including the data enable signal DE or the vertical sync signal, the horizontal sync signal, the clock signal, etc. from the image processing unit 10. The timing controller 20 outputs a gate timing control signal GDC for controlling an operation timing of the gate driver 40 and a data timing control signal DDC for controlling an operation timing of the data driver 30 based on the driving signal. The timing controller 20 is also formed on a control circuit board in an IC form.

In addition, the data driver 30 samples and latches the data signal DATA received from the timing controller 20 in response to the data timing control signal DDC supplied from the timing controller 20 and converts the sampled and latched data signal DATA into a gamma reference voltage. The data driver 30 then outputs the gamma reference voltage. In particular, the data driver 30 outputs the data signal DATA through data lines DL1 to DLn. Further, the data driver 30 is formed on a data circuit substrate in an IC form.

The gate driver 40 outputs a gate signal while shifting a level of a gate voltage in response to the gate timing control signal GDC supplied from the timing controller 20. The gate driver 40 outputs the gate signal through gate lines GL1 to GLm, and is formed on a gate circuit board in an IC form or is formed on the display panel 50 in a gate-in panel (GIP) manner.

In addition, the display panel 50 displays an image in response to the data signal DATA and the gate signal respectively received from the data driver 30 and the gate driver 40, and as shown includes subpixels SP displaying the image.

Referring to FIG. 3, each subpixel includes a switching transistor SW, a driving transistor DR, a capacitor Cst, a compensation circuit CC, and an OLED. Further, the OLED operates to emit light based on a driving current generated by the driving transistor DR.

The switching transistor SW performs a switching operation so that a data signal supplied through a first data line DL1 is stored in the capacitor Cst as a data voltage in response to a gate signal supplied through a first gate line GL1. In addition, the driving transistor DR operates so that the driving current flows between a high potential power line VDD and a low potential power line GND based on the data voltage stored in the capacitor Cst.

The compensation circuit CC is a circuit for compensating a threshold voltage of the driving transistor DR. The compensation circuit CC includes one or more thin film transistors and a capacitor. Configuration of the compensation circuit CC may be variously changed depending on a compensation method. As shown in FIG. 4, the subpixel including the compensation circuit CC further includes a signal line and a power line for driving a compensation TFT and supplying a predetermined signal or electric power. The added signal line may be defined as a 1-2 gate line GL1b for driving the compensation TFT included in the subpixel. In FIG. 4, "GL1a" is a 1-1 gate line for driving the switching transistor SW. The added power line may be defined as an initialization power line INIT for initializing a predetermined node of the subpixel at a predetermined voltage. However, this is merely an example, and the embodiment of the invention is not limited thereto.

In addition, FIGS. 3 and 4 illustrate that one subpixel includes the compensation circuit CC, as an example. However, the compensation circuit CC may be omitted when an object (for example, the data driver 30) to be compensated is positioned outside the subpixel. The subpixel basically has a configuration of 2T(Transistor)1C(Capacitor) including the switching transistor SW, the driving transistor DR, the capacitor, and the OLED. However, when the compensation circuit CC is added to the subpixel, the subpixel may have various configurations of 3T1C, 4T2C, 5T2C, and the like.

Referring to FIG. 5, a display panel of an OLED display according to an embodiment of the invention includes a substrate 110, a display portion DP, a pad portion 60, first and second gate drivers 40a and 40b, a high potential power line VDD, a low potential power line GND, and an initialization power line INIT. As shown, the pad portion 60 is formed at an upper edge of the substrate 110. Also, the pad portion 60 is electrically connected to an external circuit board. For example, the pad portion 60 is connected to a data circuit board, on which a data driver is mounted, or a control circuit board, on which a timing controller is mounted, and the like.

The first and second gate drivers 40a and 40b are circuits outputting a gate signal to subpixels SP formed in the display portion DP. Also, the first gate driver 40a is positioned on the left side of the display portion DP and supplies a gate signal, and the second gate driver 40b is positioned on the right side of the display portion DP and supplies a gate signal.

Further, the high potential power line VDD is used to transfer a high potential power received from the outside through the pad portion 60 to the subpixels SP of the display portion DP. The low potential power line GND is used to transfer a low potential power (or a ground level power) received from the outside through the pad portion 60 to the subpixels SP of the display portion DP. Also, the initialization power line INIT is used to transfer an initialization power received from the outside through the pad portion 60 to the subpixels SP of the display portion DP.

As shown, the high potential power line VDD and the initialization power line INIT are disposed between the pad portion 60 and the display portion DP. In particular, the low potential power line GND has an area between the pad portion 60 and the display portion DP and an area surrounding the display portion DP. The high potential power line VDD, the low potential power line GND, and the initialization power line INIT form a pair and are disposed on the display panel. As shown in FIG. 5, two pairs each including the lines VDD, GND, and INIT can be respectively disposed on the left and right sides of the pad portion 60.

Referring to FIG. 6, an OLED display 100 according to an embodiment of the invention includes a substrate 110 made of glass, plastic, or metal, etc. In the embodiment of the present invention, the substrate 110 may be made of plastic, and more specifically, may be made of a polyimide substrate. Thus, the substrate 110 according to the embodiment of the invention has a flexible characteristic. Further, a first buffer layer 112 is positioned on the substrate 110, and protects a thin film transistor formed in a subsequent process from impurities, for example, alkali ions discharged from the substrate 110. The first buffer layer 112 may be a silicon oxide (SiOx) layer, a silicon nitride (SiNx) layer, or a multilayer thereof.

In addition, a shield layer 114 is positioned on the first buffer layer 112 and prevents a reduction in a panel driving current which may be generated by using the polyimide substrate. The shield layer 114 may be formed of a conductive material, a semiconductor such as silicon, a metal, and the like. A second buffer layer 116 is positioned on the shield layer 114 and protects a thin film transistor formed in a subsequent process from impurities, for example, alkali ions discharged from the shield layer 114. The second buffer layer 116 may be a silicon oxide (SiOx) layer, a silicon nitride (SiNx) layer, or a multilayer thereof.

Also, a semiconductor layer 120 is positioned on the second buffer layer 116 and may be formed of a silicon semiconductor or an oxide semiconductor. The silicon semiconductor may include amorphous silicon or crystallized polycrystalline silicon. The polycrystalline silicon has a high mobility (for example, more than 100 cm$^2$/Vs), low energy power consumption, and excellent reliability, and thus can be applied to a gate driver and/or a multiplexer (MUX) for use in a driving element or applied to a driving TFT of each pixel of the OLED display 100.

Because the oxide semiconductor has a low off-current, the oxide semiconductor is suitable for a switching TFT which has a short on-time and a long off-time. Further, because the oxide semiconductor increases a voltage hold time of the pixel due to the low off-current, the oxide semiconductor is suitable for a display device requiring a slow driving and/or low power consumption. In addition, the semiconductor layer 120 includes a drain region and a source region each including p-type or n-type impurities. The semiconductor layer 120 also includes a channel region in addition to the drain region and the source region.

Further, a gate insulating layer 125 is positioned on the semiconductor layer 120, and may be a silicon oxide (SiOx) layer, a silicon nitride (SiNx) layer, or a multilayer thereof. A gate electrode 130 is positioned on the gate insulating layer 125 in a predetermined portion of the semiconductor layer 120, namely, at a location corresponding to the channel region when impurities are injected. The gate electrode 130 is formed of one of molybdenum (Mo), aluminum (Al), chrome (Cr), gold (Au), titanium (Ti), nickel (Ni), neodymium (Nd), and copper (Cu), or a combination thereof. Further, the gate electrode 130 may be a multilayer formed of one of molybdenum (Mo), aluminum (Al), chrome (Cr), gold (Au), titanium (Ti), nickel (Ni), neodymium (Nd), and copper (Cu), or a combination thereof. For example, the gate electrode 130 may be formed as a double layer of Mo/Al—Nd or Mo/Al.

An interlayer dielectric layer 135 is positioned on the gate electrode 130, and may be a silicon oxide (SiOx) layer, a silicon nitride (SiNx) layer, or a multilayer thereof. Contact holes 137 and 138 exposing a portion of the semiconductor layer 120 are also formed by etching a portion of each of the interlayer dielectric layer 135 and the gate insulating layer 125. In this instance, the portion of the semiconductor layer 120 exposed by the contact holes 137 and 138 may be the source region and the drain region.

A source electrode 140 and a drain electrode 145 are also electrically connected to the semiconductor layer 120 through the contact holes 137 and 138 passing through the interlayer dielectric layer 135 and the gate insulating layer 125. Each of the source electrode 140 and the drain electrode 145 may be formed as a single layer or a multilayer. When each of the source electrode 140 and the drain electrode 145 is formed as the single layer, each of the source electrode 140 and the drain electrode 145 may be formed of one of molybdenum (Mo), aluminum (Al), chrome (Cr), gold (Au), titanium (Ti), nickel (Ni), neodymium (Nd), and copper (Cu), or a combination thereof. When each of the source electrode 140 and the drain electrode 145 is formed as the multilayer, each of the source electrode 140 and the drain electrode 145 may be formed as a double layer of Mo/Al—Nd or a triple layer of Ti/Al/Ti, Mo/Al/Mo or Mo/Al—Nd/Mo. Thus, a thin film transistor TFT including the semiconductor layer 120, the gate electrode 130, the source electrode 140, and the drain electrode 145 is formed.

Further, a passivation layer 136 is positioned on the substrate 110 including the thin film transistor TFT. The passivation layer 136 is a protective layer protecting the thin film transistor TFT underlying the passivation layer 136 and may be a silicon oxide (SiOx) layer, a silicon nitride (SiNx) layer, or a multilayer thereof. A planarization layer 150 is also positioned on the passivation layer 136 for reducing a height difference of an underlying structure. The planarization layer 150 may be formed of an organic material such as polyimide, benzocyclobutene-based resin, and acrylate, and be formed through a spin-on glass (SOG) method for coating the organic material in a liquid state and then curing the organic material. As shown, the planarization layer 150 includes a via hole 155 exposing the drain electrode 145 of the thin film transistor TFT.

A first electrode 160 is also positioned on the planarization layer 150. The first electrode 160 is an anode and may be formed of a transparent conductive material such as indium tin oxide (ITO), indium zinc oxide (IZO), and zinc oxide (ZnO). When the first electrode 160 is a reflective electrode, the first electrode 160 further includes a reflective layer. The reflective layer may be formed of aluminum (Al), copper (Cu), silver (Ag), nickel (Ni), Pd (palladium) or a combination thereof. Preferably, the reflective layer may be formed of an Ag/Pd/Cu (APC) alloy. Thus, the first electrode 160 fills the via hole 155 and can be connected to the source electrode 145 of the thin film transistor TFT.

In addition, a bank layer 165 is positioned on the substrate 110 including the first electrode 160. The bank layer 165 is a pixel definition layer that exposes a portion of the first electrode 160 to define a pixel. The bank layer 165 may be formed of an organic material such as polyimide, benzocyclobutene-based resin, and acrylate. As shown, the bank layer 165 includes an opening 167 exposing the first electrode 160.

An organic light emitting layer 170 is positioned on the first electrode 160 exposed by the opening 167 of the bank layer 165. The organic light emitting layer 170 is a layer, in which electrons and holes combine and emit light. A hole injection layer or a hole transport layer may be positioned between the organic light emitting layer 170 and the first electrode 160, and an electron injection layer or an electron transport layer may be positioned on the organic light emitting layer 170.

Further, a second electrode 180 is positioned on the substrate 110, on which the organic light emitting layer 170 is formed. The second electrode 180 is positioned on an entire surface of the display portion DP. In addition, the second electrode 180 is a cathode electrode and may be formed of magnesium (Mg), calcium (Ca), aluminum (Al), silver (Ag), or a combination thereof each having a low work function. When the second electrode 180 is a transmissive electrode, the second electrode 180 is thin enough to transmit light, and when the second electrode 180 is a reflective electrode, the second electrode 180 is thick enough to reflect light. However, the OLED display has a problem of a poor driving or a short circuit that may be generated when the display panel is manufactured.

First Embodiment

Figure 7:
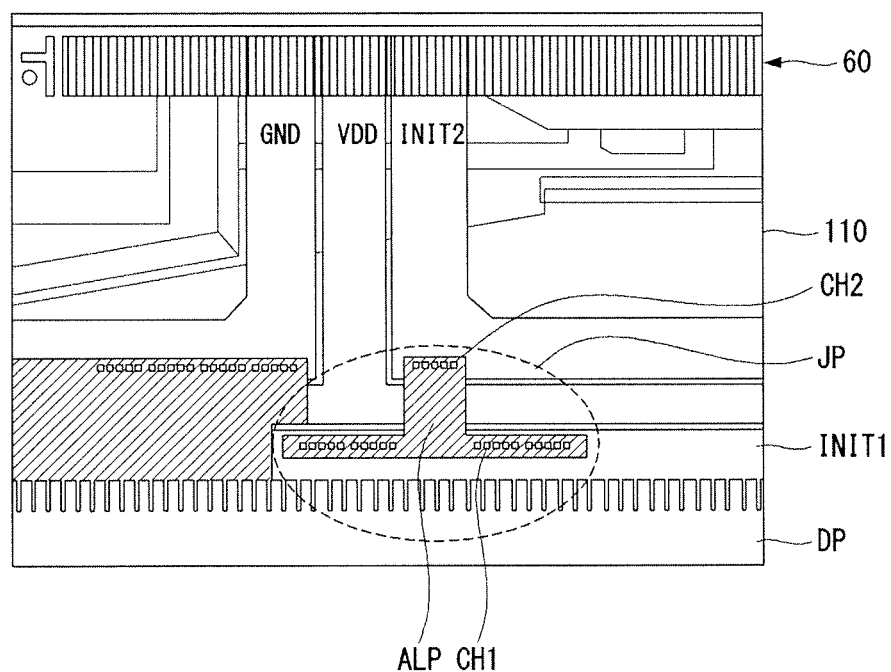
FIG. 7 is a plan view illustrating a part of an OLED display according to a first embodiment of the invention.
Figure 8:
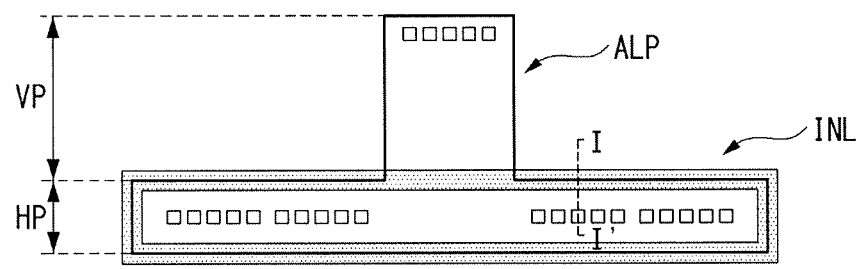
FIG. 8 is a plan view schematically illustrating a part of a line shown in FIG. 7.
Figure 9:
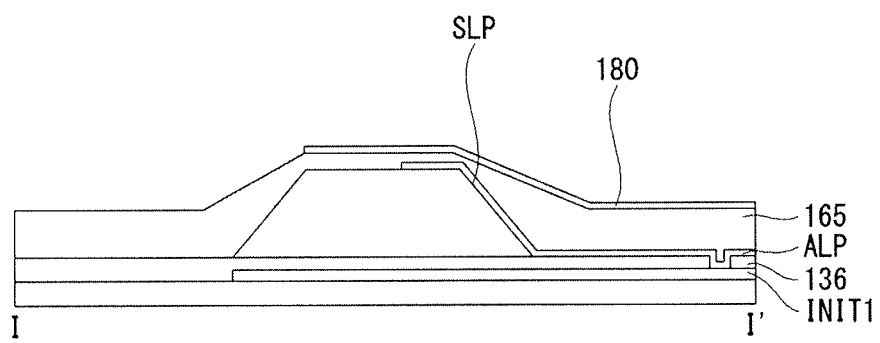
FIG. 9 is a cross-sectional view taken along line I-I' of FIG. 8.

FIG. 7 is a plan view illustrating a part of an OLED display according to a first embodiment of the invention, FIG. 8 is a plan view schematically illustrating a part of a line shown in FIG. 7, and FIG. 9 is a cross-sectional view taken along line I-I' of FIG. 8.

Referring to FIGS. 7 and 8, a first initialization power line INIT1 extended from a display portion DP and a second initialization power line INIT2 connected to a pad portion 60 are disposed on a substrate 110. Further, a high potential power line VDD is disposed between the first initialization power line INIT1 and the second initialization power line INIT2 and is connected to the pad portion 60. A low potential power line GND is disposed on one side of the high potential power line VDD and is connected to the pad portion 60.

As shown, the first initialization power line INIT1 and the second initialization power line INIT2 are connected to each other through a connection pattern ALP positioned on the first and second initialization power lines INIT1 and INIT2. In particular, the first initialization power line INIT1 is connected to the connection pattern ALP through a first contact hole CH1, and the second initialization power line INIT2 is connected to the connection pattern ALP through a second contact hole CH2.

The connection pattern ALP is formed of the same transparent conductive material as a first electrode serving as an anode of a subpixel. The connection pattern ALP includes a horizontal portion HP parallel to the first initialization power line INIT1 and a vertical portion VP vertical to the first initialization power line INIT1. As shown, the horizontal portion HP of the connection pattern ALP also overlaps the first initialization power line INIT1 and is connected to the first initialization power line INIT1. The vertical portion VP of the connection pattern ALP jumps the high potential power line VDD and is connected to the second initialization power line INIT2.

In addition, the connection pattern ALP is surrounded by an insulating layer INL. Namely, the insulating layer INL is positioned to surround the connection pattern ALP. More specifically, the insulating layer INL surrounds the horizontal portion HP of the connection pattern ALP and does not surround the vertical portion VP of the connection pattern ALP. Because the insulating layer INL is formed of the same material as the planarization layer of the subpixel SP shown in FIG. 6 and the vertical portion VP of the connection pattern ALP is adjacent to the pad portion 60, the insulating layer INL is not formed around the vertical portion VP. However, the embodiment of the invention is not limited thereto. For example, the insulating layer INL may be positioned to surround the vertical portion VP of the connection pattern ALP.

Referring to FIG. 9 illustrating a cross-sectional structure of a jumping portion JP, the insulating layer INL is positioned on a passivation layer 136. The insulating layer INL is designed to have an inclined portion SLP. The connection pattern ALP is positioned on the insulating layer INL and the passivation layer 136. More specifically, the connection pattern ALP is formed on the passivation layer 136 along the inclined portion SLP of the insulating layer INL from an upper surface of the insulating layer INL. In the embodiment disclosed herein, the connection pattern ALP is formed of the same transparent conductive material (for example, ITO) as the first electrode serving as the anode. In this instance, a residue defect, in which ITO partially remains in an etched portion of the connection pattern ALP after the connection pattern ALP is patterned. Thus, the embodiment of the invention forms the insulating layer INL having the inclined portion SLP at an edge of the connection pattern ALP.

When an edge (i.e., a portion that is etched and removed later) of the connection pattern ALP is positioned on the insulating layer INL, a patterned portion of the connection pattern ALP is positioned at an elevated position. Thus, an exposure amount at an upper part of the connection pattern ALP increases in a process for patterning the connection pattern ALP, and an amount of etchant applied to the connection pattern ALP increases. As a result, the residue defect of the connection pattern ALP can be prevented.

In the embodiment of the invention, when an area of the insulating layer INL increases or an inclination angle of the inclined portion SLP of the insulating layer INL increases, the residue defect of the connection pattern ALP can be prevented more certainly. However, the area of the insulating layer INL cannot increase unlimitedly due to other components adjacent to the insulating layer INL. Thus, the area and the inclination angle of the insulating layer INL may be properly adjusted. A bank layer 165 is also positioned on the connection pattern ALP which is formed on the substrate 110 and a second electrode 180 serving as a cathode is positioned on the bank layer 165.

As described above, the OLED display according to the first embodiment of the invention forms the connection pattern ALP connecting the first initialization power line INIT1 and the second initialization power line INIT2 in the jumping portion JP and forms the insulating layer INL at the edge of the connection pattern ALP, thereby preventing the residue of the connection pattern ALP.

Figure 10:
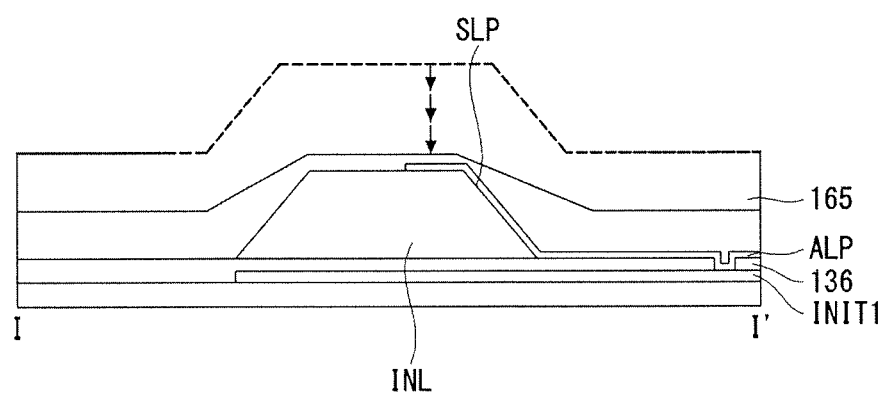
FIGS. 10 and 11 are cross-sectional views illustrating that a short circuit is generated in a jumping portion of a display device.
Figure 11:
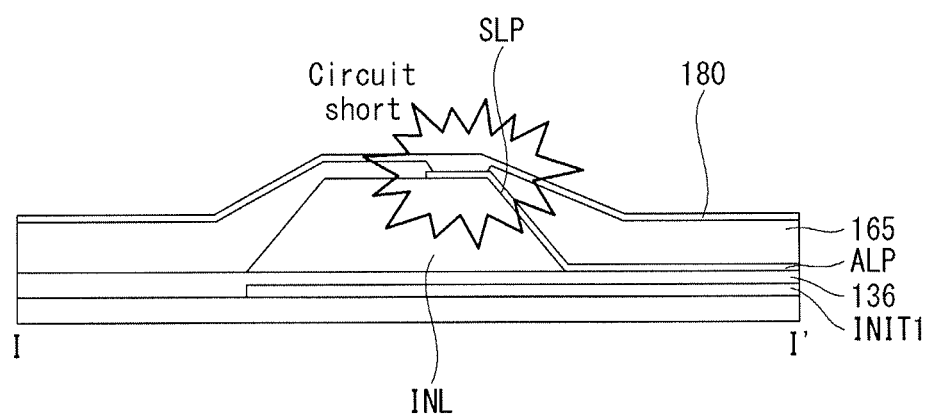

Next, FIGS. 10 and 11 are cross-sectional views illustrating that a short circuit is generated in a jumping portion of a display device. Referring to FIGS. 10 and 11, a bank layer 165 is formed on a connection pattern ALP by thickly coating an organic material and then exposing and baking the organic material. The bank layer 165 corresponding to the insulating layer INL is more exposed to UV light due to a height of the insulating layer INL. Hence, because a volume of the insulating layer INL decreases in a subsequent baking process, the connection pattern ALP may be exposed. If the connection pattern ALP is exposed, a short circuit may be generated due to a contact between a second electrode 180 formed on the bank layer 165 and the connection pattern ALP.

Hereinafter, according to a second embodiment of the present invention, a display device for preventing a short circuit generated in a jumping portion is described.

Second Embodiment

Figure 12:
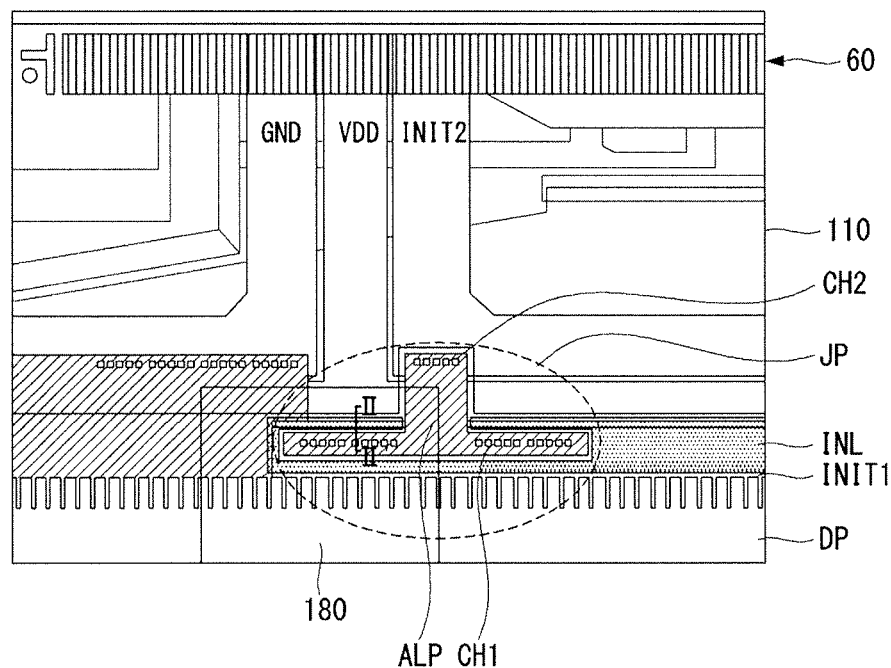
FIG. 12 is a plan view illustrating a part of a display device according to a second embodiment of the invention.
Figure 13:
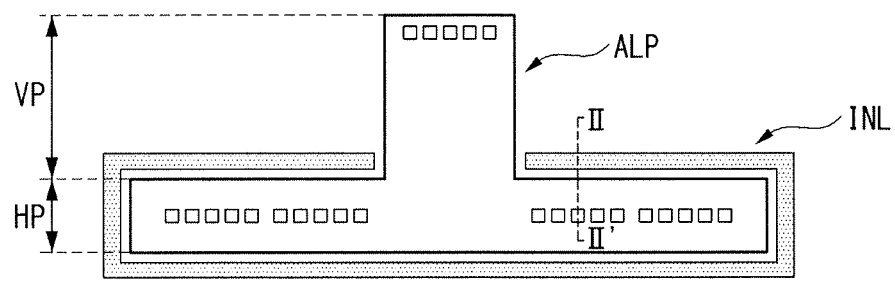
FIG. 13 is a plan view schematically illustrating a part of a line shown in FIG. 12.
Figure 14:
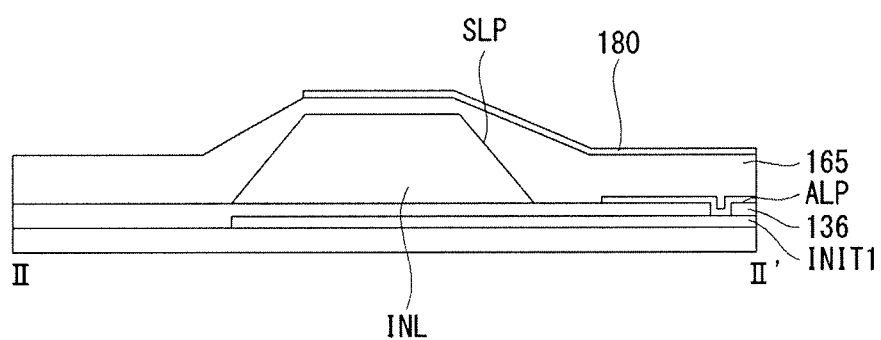
FIG. 14 is a cross-sectional view taken along line II-II' of FIG. 13.
Figure 15:
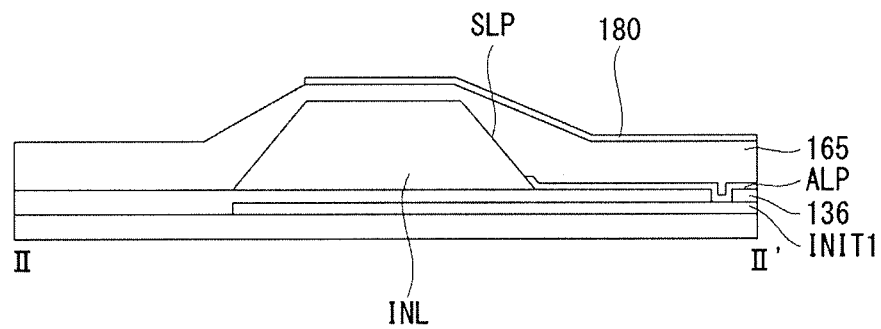
FIG. 15 is a cross-sectional view illustrating another embodiment of FIG. 14.

FIG. 12 is a plan view illustrating a part of a display device according to a second embodiment of the invention, FIG. 13 is a plan view schematically illustrating a part of a line shown in FIG. 12, FIG. 14 is a cross-sectional view taken along line II-II' of FIG. 13, and FIG. 15 is a cross-sectional view illustrating another embodiment of FIG. 14. Structures and components identical or equivalent to those described in the first embodiment are designated with the same reference numerals, and a further description may be briefly made or may be entirely omitted in the second embodiment.

Referring to FIGS. 12 and 13, a first initialization power line INIT1 extended from a display portion DP and a second initialization power line INIT2 connected to a pad portion 60 are disposed on a substrate 110. A high potential power line VDD is disposed between the first initialization power line INIT1 and the second initialization power line INIT2 and is connected to the pad portion 60. Further, a low potential power line GND is disposed on one side of the high potential power line VDD and is connected to the pad 60. The first initialization power line INIT1 and the second initialization power line INIT2 are connected to each other through a connection pattern ALP positioned on the first and second initialization power lines INIT1 and INIT2.

The connection pattern ALP is surrounded by an insulating layer INL. Namely, the insulating layer INL is positioned to surround the connection pattern ALP. The insulating layer INL according to the second embodiment of the invention is spaced apart from the connection pattern ALP while surrounding the connection pattern ALP. In the first embodiment of the invention, the connection pattern ALP is positioned from the upper surface of the insulating layer INL, but the connection pattern ALP on the upper surface of the insulating layer INL may be exposed by the bank layer. On the other hand, in the second embodiment of the invention, the connection pattern ALP is spaced apart from the insulating layer INL and is not exposed.

In the same manner as the first embodiment of the invention, the insulating layer INL surrounds a horizontal portion HP of the connection pattern ALP and does not surround a vertical portion VP of the connection pattern ALP. Because the insulating layer INL is formed of the same material as the planarization layer of the subpixel SP shown in FIG. 6 and the vertical portion VP of the connection pattern ALP is adjacent to the pad portion, the insulating layer INL is not formed around the vertical portion VP. However, the embodiment of the invention is not limited thereto. For example, the insulating layer INL may be positioned to surround the vertical portion VP of the connection pattern ALP. Thus, the insulating layer INL is formed in an island pattern surrounding the connection pattern ALP, and more specifically, in an island pattern surrounding the horizontal portion HP except the vertical portion VP of the connection pattern ALP.

Referring to FIG. 14 illustrating a cross-sectional structure of a jumping portion JP, a passivation layer 136 is positioned on the first initialization power line INIT1, and the insulating layer INL and the connection pattern ALP are positioned on the passivation layer 136.

The connection pattern ALP passes through the passivation layer 136 and is connected to the first initialization power line INIT1. The insulating layer INL is configured to have an inclined portion SLP so that the connection pattern ALP does not remain after the connection pattern ALP is patterned. Further, the connection pattern ALP is positioned on the passivation layer 136, and is spaced apart from the insulating layer INL.

In the embodiment disclosed herein, the connection pattern ALP is formed of the same transparent conductive material (for example, ITO) as a first electrode serving as an anode. In this instance, there occurs a residue defect, in which ITO partially remains in an etched portion of the connection pattern ALP after the connection pattern ALP is patterned. Thus, the embodiment of the present invention is configured such that an edge of the connection pattern ALP, that is etched and then removed, is positioned on the inclined portion SLP of the insulating layer INL.

When the edge of the connection pattern ALP, that is etched and then removed, is positioned on the insulating layer INL, a patterned portion of the connection pattern ALP is positioned at an elevated position. Thus, an exposure amount at an upper part of the connection pattern ALP increases in a process for patterning the connection pattern ALP, and an amount of etchant applied to the connection pattern ALP increases. As a result, the residue defect of the connection pattern ALP can be prevented.

In addition, the connection pattern ALP is spaced apart from the insulating layer INL at a predetermined distance through the above-described patterning process. When the connection pattern ALP is spaced apart from the insulating layer INL, a bank layer 165 positioned in a formation area of the connection pattern ALP can have a uniform thickness. Thus, the connection pattern ALP can be prevented from being exposed to the outside of the bank layer 165.

The predetermined distance is not particularly limited and may have any value as long as the connection pattern ALP is not exposed by the bank layer 165. Thus, as shown in FIG. 15, a portion of the connection pattern ALP according to the second embodiment of the invention may be positioned on the insulating layer INL. The bank layer 165 is positioned on the connection pattern ALP which is formed on the substrate, and a second electrode 180 serving as a cathode is positioned on the bank layer 165.

As described above, the display device according to the second embodiment of the invention forms the connection pattern ALP connecting the first initialization power line INIT1 and the second initialization power line INIT2 in the jumping portion JP and forms the insulating layer INL positioned adjacent to the connection pattern ALP, thereby preventing the residue of the connection pattern ALP.

Further, the embodiments of the invention are configured such that the connection pattern formed in the jumping portion of the first and second initialization power lines is spaced apart from the insulating layer, thereby preventing a short circuit between the connection pattern and the second electrode being generated when the connection pattern is upwardly exposed to the bank layer.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a substrate;
a display portion positioned on the substrate and a pad portion positioned outside the display portion;
a jumping portion positioned between the display portion and the pad portion;
at least two power lines positioned on the substrate;
a connection pattern connecting the at least two power lines to each other in the jumping portion; and
an insulating layer spaced apart from the connection pattern and surrounding the connection pattern.

2. The display device of claim 1, wherein the at least two power lines include a first initialization power line extended from the display portion and a second initialization power line connected to the pad portion.

3. The display device of claim 2, wherein the connection pattern includes a horizontal portion parallel to the first initialization power line and a vertical portion vertical to the first initialization power line.

4. The display device of claim 3, wherein the insulating layer surrounds the horizontal portion of the connection pattern except the vertical portion of the connection pattern.

5. The display device of claim 2, wherein a high potential power line is positioned between the first initialization power line and the second initialization power line.

6. The display device of claim 5, wherein the connection pattern jumps the high potential power line and connects the first initialization power line to the second initialization power line.

7. The display device of claim 5, wherein the insulating layer partially overlaps the high potential power line.

8. The display device of claim 1, wherein the insulating layer includes an inclined portion and is formed in an island pattern surrounding the connection pattern.

9. The display device of claim 1, wherein the at least two power lines are positioned on the substrate,
wherein a passivation layer is positioned on the at least two power lines, and
wherein the insulating layer and the connection pattern are positioned on the passivation layer.

10. The display device of claim 9, wherein the connection pattern passes through the passivation layer and is connected to each of the at least two power lines.

11. A display device comprising:
a display portion on a substrate;
a pad portion disposed outside the display portion on the substrate;
a first initialization power line extended from the display portion;
a second initialization power line connected to the pad portion;
a high potential power line disposed between the first and second initialization power lines;
a low potential power line disposed on one side of the high potential power line and connected to the pad portion;
a jumping portion disposed between the display portion and the pad portion;
a connection pattern for connecting the first and second initialization power lines to each other in the jumping portion; and
an insulating layer surrounding a horizontal portion of the connection pattern and not surrounding a vertical portion of the connection pattern.

12. The display device of claim 11, wherein the connection pattern includes the horizontal portion parallel to the first initialization power line and the vertical portion vertical to the first initialization power line.

13. The display device of claim 12, wherein the insulating layer is spaced apart from the connection pattern by a predetermined distance.

14. The display device of claim 11, wherein the connection pattern jumps the high potential power line and connects the first initialization power line to the second initialization power line.

15. The display device of claim 11, wherein the insulating layer includes an inclined portion and is formed in an island pattern surrounding the connection pattern.

16. The display device of claim 11, wherein the connection pattern includes a transparent conductive material.

17. The display device of claim 11, wherein the insulating layer includes an organic material including at least one of polyimide, benzocyclobutene-based resin, and acrylate.

18. The display device of claim 11, wherein the first and second initialization power lines are formed of a transparent conductive material.

19. The display device of claim 11, wherein the connection pattern includes a same transparent conductive material as a first electrode serving as an anode of a subpixel.

20. A method of manufacturing a display device, the method comprising:
providing a display portion on a substrate;
providing a pad portion disposed outside the display portion on the substrate;
forming a first initialization power line extended from the display portion;
forming a second initialization power line connected to the pad portion;
forming a high potential power line disposed between the first and second initialization power lines;
forming a low potential power line disposed on one side of the high potential power line and connected to the pad portion;
providing a jumping portion disposed between the display portion and the pad portion;

forming a connection pattern for connecting the first and second initialization power lines to each other in the jumping portion; and forming an insulating layer surrounding a horizontal portion of the connection pattern and not surrounding a vertical portion of the connection pattern.

* * * * *